(12) United States Patent
Yang et al.

(10) Patent No.: US 12,546,004 B2
(45) Date of Patent: *Feb. 10, 2026

(54) SEMICONDUCTOR MANUFACTURING APPARATUS

(71) Applicant: SAMSUNG ELECTRONICS CO., LTD., Suwon-si (KR)

(72) Inventors: Jae Hyun Yang, Suwon-si (KR); Sang Yub Ie, Hwaseong-si (KR); Tae Yong Kim, Suwon-si (KR); Phil Ouk Nam, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 134 days.

This patent is subject to a terminal disclaimer.

(21) Appl. No.: 18/373,364

(22) Filed: Sep. 27, 2023

(65) Prior Publication Data

US 2024/0018657 A1 Jan. 18, 2024

Related U.S. Application Data

(62) Division of application No. 16/983,142, filed on Aug. 3, 2020, now Pat. No. 11,913,114.

(30) Foreign Application Priority Data

Oct. 14, 2019 (KR) .................. 10-2019-0126586

(51) Int. Cl.
*C23C 16/455* (2006.01)
*H01L 21/67* (2006.01)
*H01L 21/673* (2006.01)

(52) U.S. Cl.
CPC .. *C23C 16/45578* (2013.01); *C23C 16/45546* (2013.01); *C23C 16/45595* (2013.01); *H01L 21/67* (2013.01); *H01L 21/673* (2013.01)

(58) Field of Classification Search
CPC ........ C23C 16/45578; C23C 16/45546; C23C 16/45595; C23C 16/45525; H01L 21/67;
(Continued)

(56) References Cited

U.S. PATENT DOCUMENTS 4,062,318 A 12/1977 Ban et al.
4,096,822 A 6/1978 Yamawaki et al.
(Continued)

FOREIGN PATENT DOCUMENTS

CN 111868897 10/2020
EP 4365328 A1 * 5/2024 ........... C23C 16/345
(Continued)

OTHER PUBLICATIONS

1st OA issued in corresponding application No. KR 10-2019-0126586 on Dec. 12, 2023.

*Primary Examiner* — Jeffrie R Lund
(74) *Attorney, Agent, or Firm* — MORGAN, LEWIS & BOCKIUS LLP

(57) ABSTRACT

A semiconductor manufacturing apparatus including a process chamber and a boat having a support member supporting substrates arranged in a first direction. An inner tube encloses the boat and includes a slit along a side wall. A nozzle supplies a process gas and includes a gas injection port at a position corresponding to the slit. The gas injection port includes a first inlet and first outlet. The slit includes a second inlet and second outlet. A distance to an end of the first inlet from a center line that connects a center of the first inlet and a center of the second outlet is different from the distance from the center line to an end of the first outlet and/or a distance from the center line to an end of the second inlet is different from a distance from the center line to an end of the second outlet.

10 Claims, 11 Drawing Sheets

(58) Field of Classification Search
CPC .............. H01L 21/673; H01L 21/67017; H01L 21/0228
USPC ......................................................... 118/715
See application file for complete search history.

(56) References Cited

U.S. PATENT DOCUMENTS

| | | | |
|---|---|---|---|
| 4,747,368 A | 5/1988 | Brien et al. | |
| 5,897,311 A * | 4/1999 | Nishi | H01L 21/67309 432/239 |
| 5,925,188 A | 7/1999 | Oh | |
| 6,062,853 A * | 5/2000 | Shimazu | H01L 21/6875 211/41.18 |
| 6,099,302 A * | 8/2000 | Hong | C30B 31/14 211/41.18 |
| 6,135,053 A | 10/2000 | Okamura | |
| 10,811,271 B2 * | 10/2020 | Yoshida | C23C 16/45578 |
| 11,555,246 B2 * | 1/2023 | Shimada | H01L 21/67017 |
| 11,913,114 B2 * | 2/2024 | Yang | C23C 16/45595 |
| 12,062,546 B2 * | 8/2024 | Yoshida | H01L 21/31 |
| 2001/0025605 A1 | 10/2001 | Nagakura | |
| 2001/0050054 A1 | 12/2001 | Kwag et al. | |
| 2001/0052556 A1 | 12/2001 | Ting et al. | |
| 2002/0084352 A1 | 7/2002 | Chen | |
| 2004/0112290 A1 | 6/2004 | Li et al. | |
| 2005/0282101 A1 * | 12/2005 | Adachi | H01L 21/67323 432/253 |
| 2007/0007646 A1 * | 1/2007 | Yamaguchi | H01L 21/67109 257/727 |
| 2007/0059128 A1 * | 3/2007 | Yudovsky | H01L 21/67309 414/217 |
| 2007/0184397 A1 * | 8/2007 | Adachi | H01L 21/67306 432/253 |
| 2008/0041798 A1 * | 2/2008 | Gilmore | H01L 21/67309 211/41.18 |
| 2008/0156260 A1 * | 7/2008 | Shive | H01L 21/67306 118/500 |
| 2008/0264343 A1 * | 10/2008 | Hagihara | H01L 21/67748 118/728 |
| 2009/0304490 A1 * | 12/2009 | Kihara | H01L 21/6732 414/800 |
| 2010/0224614 A1 * | 9/2010 | Kobayashi | H01L 21/425 219/385 |
| 2012/0000425 A1 * | 1/2012 | Park | H01L 21/67309 118/724 |
| 2013/0068161 A1 | 3/2013 | White et al. | |
| 2013/0098477 A1 | 4/2013 | Yudovsky et al. | |
| 2015/0214009 A1 | 7/2015 | Glukhoy et al. | |
| 2015/0270150 A1 * | 9/2015 | Yoo | H01L 21/67309 211/41.18 |
| 2016/0064190 A1 * | 3/2016 | Noh | H01J 37/32779 118/723 R |
| 2017/0115063 A1 * | 4/2017 | Liu | H01L 21/67109 |
| 2017/0232457 A1 | 8/2017 | Fujino et al. | |
| 2017/0294318 A1 | 10/2017 | Yoshida et al. | |
| 2018/0371614 A1 | 12/2018 | Yoshida et al. | |
| 2019/0017169 A1 | 1/2019 | Hanashima et al. | |
| 2019/0106787 A1 | 4/2019 | Ohno et al. | |
| 2019/0330738 A1 | 10/2019 | Saido et al. | |
| 2019/0345605 A1 | 11/2019 | Miruma et al. | |
| 2019/0360098 A1 | 11/2019 | Shimada et al. | |
| 2020/0026314 A1 | 1/2020 | Yamaguchi | |
| 2020/0407851 A1 | 12/2020 | Hiramatsu et al. | |
| 2021/0043485 A1 | 2/2021 | Saido et al. | |
| 2021/0108313 A1 | 4/2021 | Yang et al. | |
| 2021/0147978 A1 | 5/2021 | Hisakado et al. | |
| 2022/0199443 A1 * | 6/2022 | Takebayashi | C23C 16/4412 |
| 2022/0254668 A1 * | 8/2022 | Oosterlaken | H01L 21/67303 |
| 2023/0140283 A1 * | 5/2023 | Oosterlaken | H01L 21/67303 118/728 |
| 2024/0018657 A1 * | 1/2024 | Yang | H01L 21/67 |

FOREIGN PATENT DOCUMENTS

| | | | |
|---|---|---|---|
| JP | 05-320893 | | 12/1993 |
| JP | 2001217252 A | * | 8/2001 |
| JP | 2009-124105 | | 6/2009 |
| JP | 2012-175020 | | 9/2012 |
| JP | 2015185579 A | * | 10/2015 |
| KR | 10-1975928 | | 3/2013 |
| KR | 10-2015-0013488 | | 2/2015 |
| KR | 10-2017-0042789 | | 4/2017 |
| KR | 10-2018-0048444 | | 5/2018 |
| KR | 10-1952549 | | 2/2019 |
| KR | 10-2022-0082151 | | 6/2022 |
| WO | 2015041376 | | 3/2015 |

* cited by examiner

SEMICONDUCTOR MANUFACTURING APPARATUS

CROSS-REFERENCE TO RELATED APPLICATIONS

This application is a divisional of U.S. patent application Ser. No. 16/983,142 filed on Aug. 3, 2020, which claims priority under 35 U.S.C. § 119 to Korean Patent Application No. 10-2019-0126586, filed on Oct. 14, 2019 in the Korean Intellectual Property Office, the disclosures of which are incorporated by reference in their entireties herein.

TECHNICAL FIELD

Exemplary embodiments of the present inventive concept relate to a semiconductor manufacturing apparatus.

DISCUSSION OF RELATED ART

In recent years, design rules have been reduced as the level of integration of a semiconductor device has increased. Therefore, an area occupied by a unit cell in the semiconductor device is reduced and a line width of a pattern decreases. As a result, a thickness of a thin film becomes increasingly thinner, and it is very difficult to form the substrate to have a sufficient step coverage on the substrate.

On the other hand, an atomic layer deposition (ALD) process has been developed that forms a thin film with a thickness of an atomic layer. The atomic layer deposition injects a source gas and a reactive gas onto a substrate to grow the thin film. However, it is important that the process gas is sufficiently supplied to and discharged from the atomic layer deposition.

SUMMARY

According to an exemplary embodiment of the present inventive concepts, a semiconductor manufacturing apparatus includes a process chamber. A boat is disposed in the process chamber and includes a support member that is configured to support a plurality of substrates arranged in a first direction. An inner tube encloses the boat and includes a slit formed along a side wall of the boat. A nozzle is disposed in the process chamber and is configured to supply a process gas. The nozzle includes a gas injection port formed at a position corresponding to the slit. The gas injection port is defined by a first fluid passage face. The gas injection port includes a first inlet and a first outlet. The slit is defined by a second fluid passage face, and includes a second inlet and a second outlet. At least one of the following: a distance in the first direction to an end of the first inlet from a center line that connects a center of the first inlet and a center of the second outlet is different from a distance from the center line to an end of the first outlet in the first direction; and a distance from the center line to an end of the second inlet in the first direction is different from a distance from the center line to an end of the second outlet in the first direction.

According to an exemplary embodiment of the present inventive concepts, a semiconductor manufacturing apparatus includes a process chamber. A boat is disposed in the process chamber and includes a support member that is configured to support a plurality of substrates arranged in a first direction. An inner tube encloses the boat and includes a slit formed along a side wall of the boat. A nozzle tube is disposed in the process chamber and includes a side wall having a plurality of opening parts. The side wall of the nozzle tube includes a nozzle extending in the first direction. The nozzle includes a gas injection port formed at a position corresponding to one opening part along the side wall of the nozzle. The gas injection port includes an inlet through which process gas flows in from the nozzle, and an outlet through which the process gas is directed towards the slit. A width of the inlet in the first direction is different from a width of the outlet in the first direction.

According to an exemplary embodiment of the present inventive concepts, a semiconductor manufacturing apparatus includes a process chamber. A boat is disposed in the process chamber and includes a support member that is configured to support a plurality of substrates arranged in a first direction. An inner tube encloses the boat. The inner tube includes a slit formed along a side wall of the boat extending in the first direction. A nozzle is disposed in the process chamber and is configured to supply a process gas. The nozzle includes a gas injection port formed at a position corresponding to the slit. The slit is formed at a position corresponding to a space between adjacent support members and has a first inclination of an acute angle with respect to a second direction that is perpendicular to the first direction.

However, aspects of the present invention are not restricted to the one set forth herein. The above and other aspects of the present invention will become more apparent to one of ordinary skill in the art to which the present invention pertains by referencing the detailed description of exemplary embodiments of the present inventive concepts given below.

BRIEF DESCRIPTION OF THE DRAWINGS

The above and other aspects and features of the present invention will become more apparent by describing in detail exemplary embodiments thereof with reference to the attached drawings.

DETAILED DESCRIPTION OF EXEMPLARY EMBODIMENTS

Figure 1:
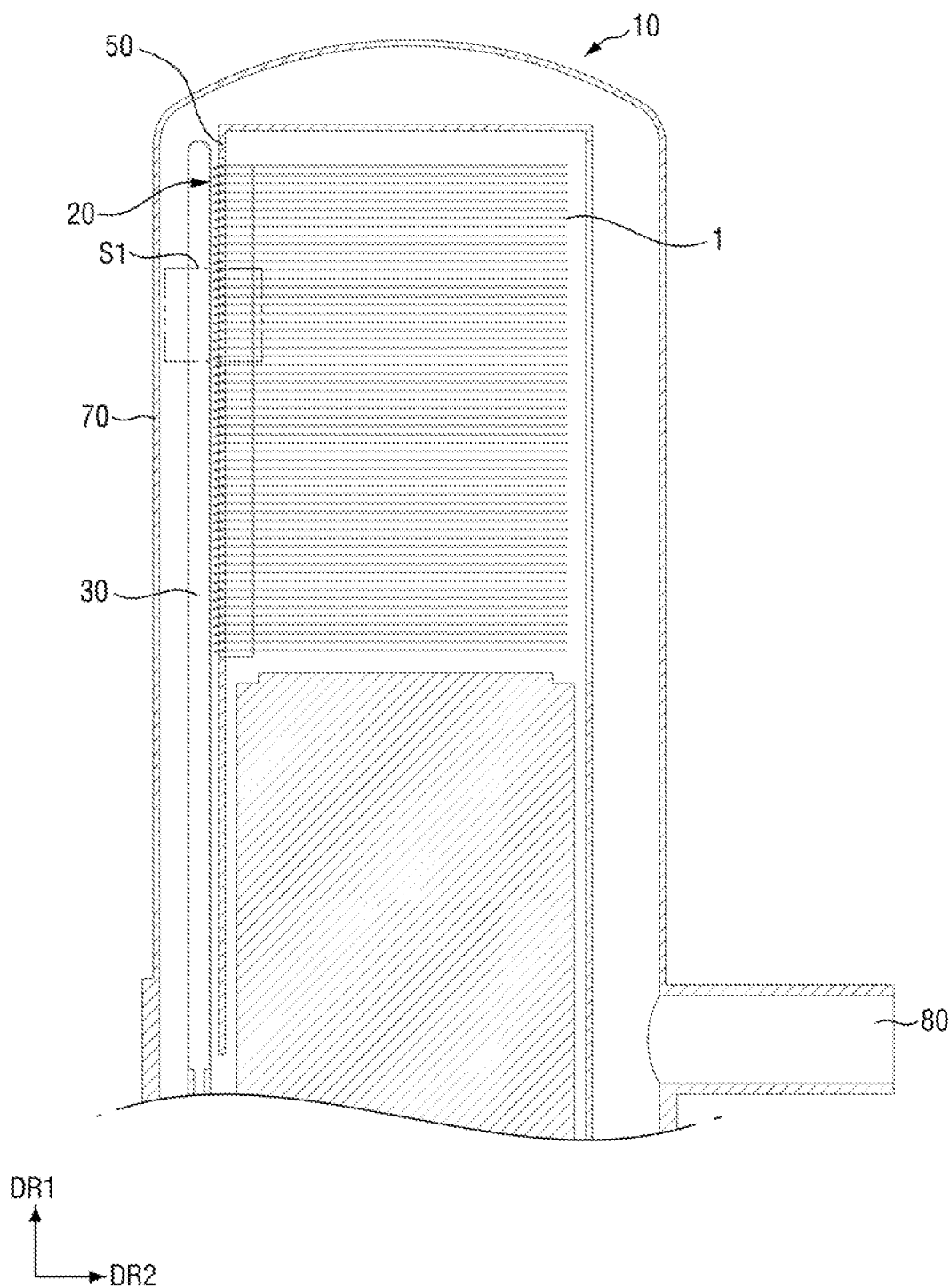
FIG. 1 is an elevational view of a semiconductor manufacturing apparatus according to an exemplary embodiment of the present inventive concepts.

Exemplary embodiments of the present inventive concepts provide an image sensor which reads out a pixel array having a pixel structure including a plurality of photoelectric conversion elements sharing a floating diffusion area with one another.

Exemplary embodiments of the present inventive concepts will be described more fully hereinafter with reference to the accompanying drawings. Like reference numerals may refer to like elements throughout this application.

Figure 2:
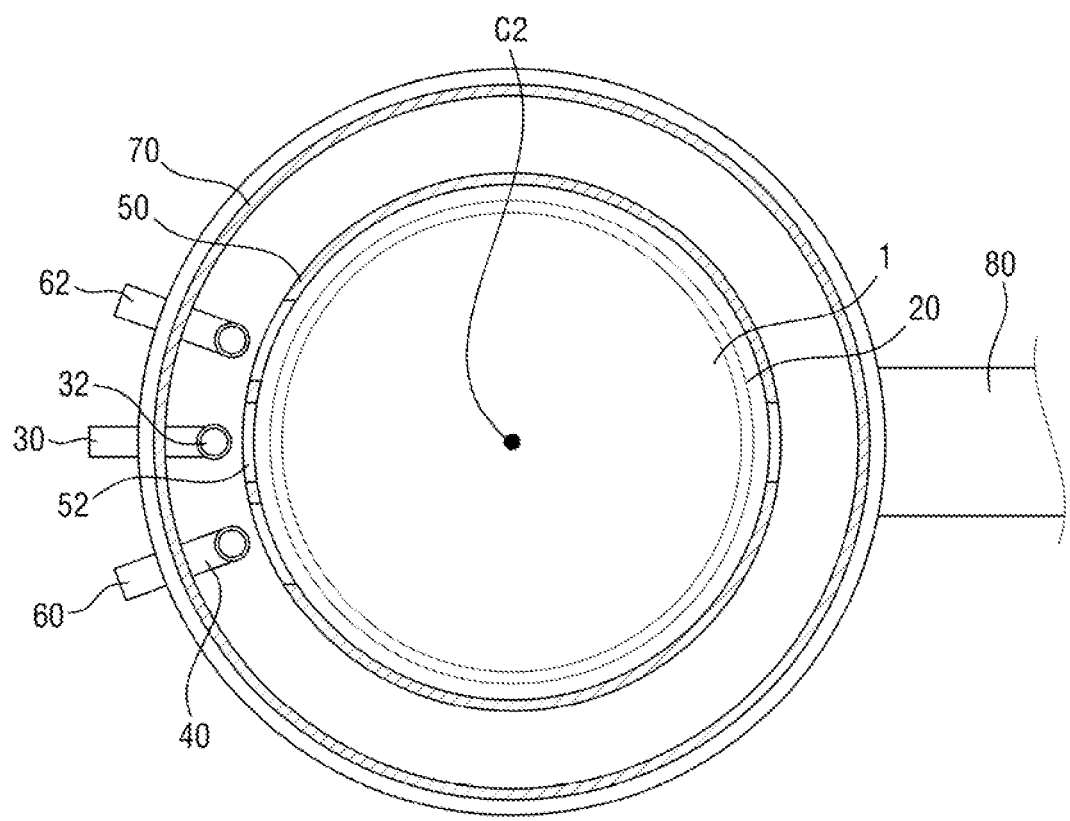
FIG. 2 is a top plan view of the semiconductor manufacturing apparatus of FIG. 1 according to an exemplary embodiment of the present inventive concepts.

FIG. 1 is a diagram for explaining a semiconductor manufacturing apparatus according to an exemplary embodiment of the present inventive concept. FIG. 1 is an elevational view of a semiconductor manufacturing apparatus according to an exemplary embodiment of the present inventive concepts. FIG. 2 is a plan view of the semiconductor manufacturing apparatus of FIG. 1.

Referring to the exemplary embodiments shown in FIGS. 1 and 2, the semiconductor manufacturing apparatus may include a process chamber 10, a boat 20, a nozzle 30, a nozzle tube 40, an inner tube 50, an outer tube 70 and a gas exhaust pipe 80.

The semiconductor manufacturing apparatus may be an apparatus that performs a semiconductor manufacturing process by supplying a process gas onto a substrate 1 such as a wafer. In an exemplary embodiment, the semiconductor manufacturing apparatus may be an atomic layer deposition (ALD). However, exemplary embodiments of the present inventive concepts are not limited thereto and the semiconductor manufacturing apparatus may be various deposition apparatuses that deposit a thin film on the substrate 1 using the process gas.

The process chamber 10 may extend longitudinally in a first direction DR1. The process chamber 10 may provide an internal space for performing a semiconductor manufacturing process on the substrate 1. In an exemplary embodiment, the process chamber 10 may be made of a material that is heat resistant at high temperatures, for example, quartz or silicon carbide (SiC). However, exemplary embodiments of the present inventive concepts are not limited thereto. In an exemplary embodiment, the semiconductor manufacturing apparatus may further include a heating unit for enclosing the process chamber 10 and heating the process chamber 10.

The boat 20 may be disposed in the process chamber 10. The boat 20 may accommodate a plurality of substrates 1 that are spaced apart in the first direction DR1.

The nozzle 30 may be disposed in the process chamber 10. The nozzle 30 may extend longitudinally in the first direction DR1.

The nozzle 30 may include a gas injection port 32. The gas injection port 32 may inject the process gas into the process chamber 10. For example, in an exemplary embodiment, the gas injection port 32 may inject a source gas including a precursor for forming a thin film on the substrate 1.

The semiconductor manufacturing apparatus according to an exemplary embodiment of the present inventive concept may further include at least one auxiliary gas nozzle. For example, as shown in the exemplary embodiment of FIG. 2, the semiconductor manufacturing apparatus may include two auxiliary gas nozzles comprising a first auxiliary gas nozzle 60 and a second auxiliary gas nozzle 62. The first and second auxiliary gas nozzles 60 and 62 may be spaced apart and disposed on both side faces of the nozzle 30 that inject the source gas. The first and second auxiliary gas nozzles 60 and 62 may be disposed to be vertically symmetric about the nozzle 30 for injecting the source gas. The first and second auxiliary gas nozzles 60 and 62 may inject auxiliary gas so that the source gas spreads to the center of the substrate 1.

The nozzle tube 40 may enclose the nozzle 30.

In an exemplary embodiment, the inner tube 50 may have a cylindrical shape with an open top and bottom. As shown in the exemplary embodiment of FIG. 2, a cross section of the inner tube 50 may have a circular ring shape. However, exemplary embodiments of the present inventive concepts are not limited thereto. The inner tube 50 may surround the perimeter of the boat 20 and may enclose the boat 20. The inner tube 50 may include a slit 52. Description will be given below with reference to FIG. 3.

In an exemplary embodiment, the outer tube 70 may have a circular ring shape. The outer tube 70 may surround the perimeter of the inner tube 50 and may enclose the inner tube 50.

A gas exhaust pipe 80 may be provided on one side of the process chamber 10. The gas exhaust pipe 80 may extend along a second direction DR2. The second direction DR2 may mean a direction perpendicular to the first direction DR1. The process gas in the process chamber 10 may be discharged to the outside through the gas exhaust pipe 80.

Figure 3:
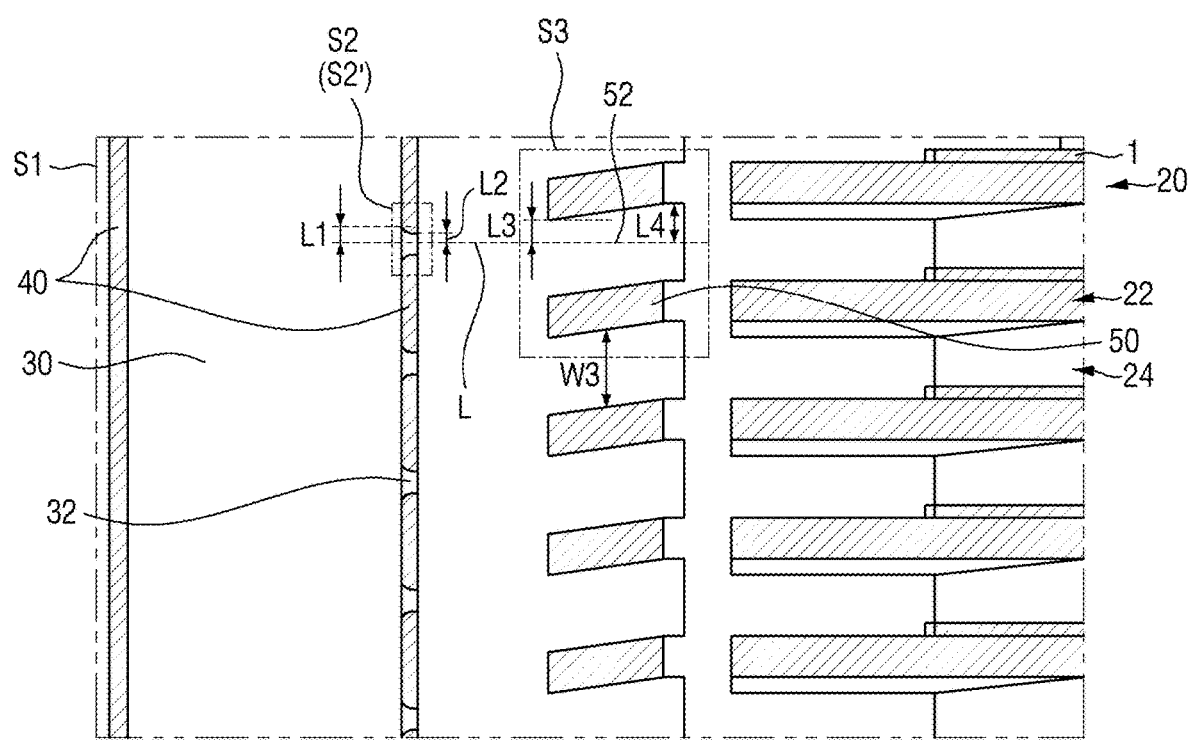
FIG. 3 is an enlarged view of a region S1 of FIG. 1 according to an exemplary embodiment of the present inventive concepts.

FIG. 3 is an enlarged view of a region S1 of FIG. 1 according to an exemplary embodiment of the present inventive concepts.

Referring to FIGS. 1 and 3, the boat 20 may include a support member 22 and a vertical member 24.

The support members 22 may be spaced apart and arranged at regular intervals along the first direction DR1. The support members 22 may stack a plurality of substrates 1 along the first direction DR1. The vertical member 24 may support both side faces of the support member 22.

The inner tube 50 may enclose the boat 20. The inner tube 50 may include a plurality of slits 52 formed in the first direction DR1. The slits 52 may be formed along the side walls of the boat 20 extending in the first direction DR1. For example, the slits 52 may be formed along the side wall of the vertical member 24.

The slits 52 may be formed at corresponding positions between the support members 22 adjacent to each other. Therefore, the number of slits 52 may be the same as the number of substrates 1 stacked on the support member 22.

The slits 52 may have a third width W3 (e.g., length in the first direction DR1). In an exemplary embodiment, the third width W3 may be less than or equal to a distance (e.g., length in the first direction) between immediately adjacent support members 22. In an exemplary embodiment, the slits 52 may be inclined in an acute angle (e.g., with respect to the second direction DR2). Hereinafter, a description will be given with reference to the exemplary embodiment of FIG. 3.

On the other hand, the side wall of the nozzle 30 extending in the first direction DR1 may include a plurality of opening parts. The nozzle 30 may include a gas injection port 32 at a position corresponding to the opening part. For example, the number of opening parts and the number of gas injection ports 32 may be the same.

The gas injection port 32 may be formed at a position corresponding to the slit 52. As shown in the exemplary embodiment of FIG. 3, the center point of the gas injection port 32 (e.g., in the first direction DR1) and a center point of the slit 52 (e.g., in the first direction DR1) may both be on a center line L. The gas injection port 32 may be disposed at the center of the slit 52 in the first direction DR1. Accordingly, the number of gas injection ports 32 may be the same as the number of slits 52.

The nozzle tube 40 may enclose an outer peripheral face of the nozzle 30 and an outer peripheral face of the gas injection port 32. For example, the nozzle tube 40 may include an opening part at a position corresponding to the gas injection port 32.

Figure 4:
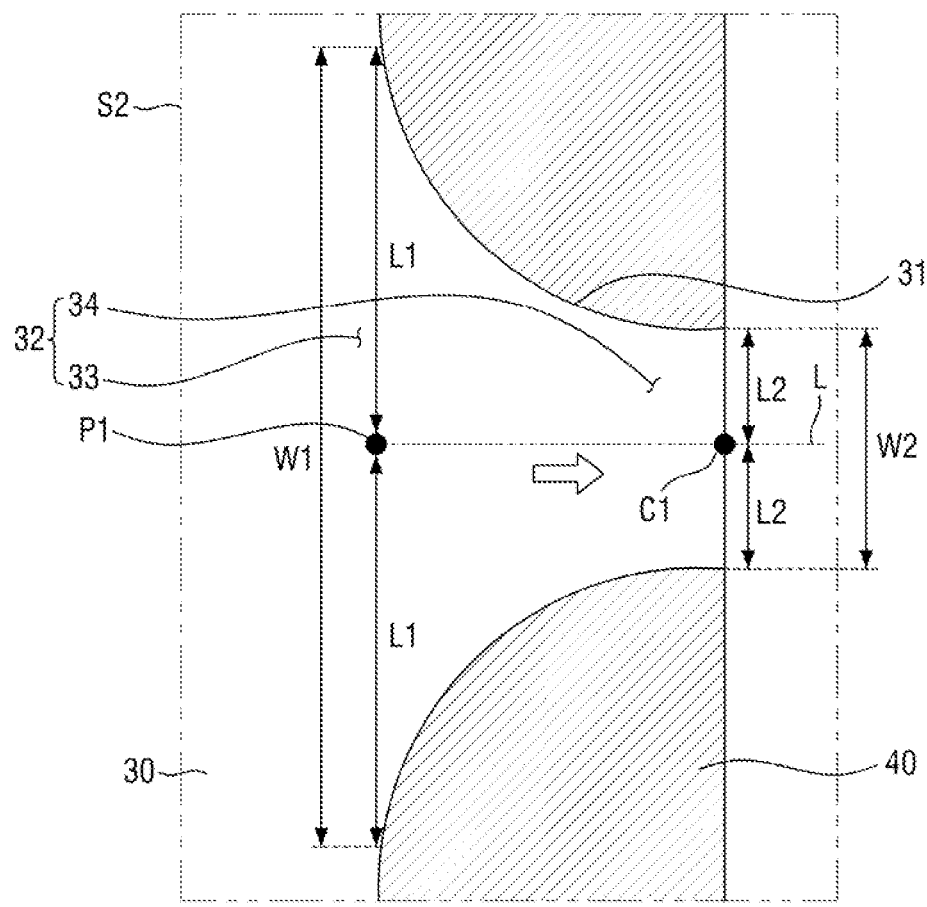
FIG. 4 is an enlarged view of a region S2 of FIG. 3 according to an exemplary embodiment of the present inventive concepts.
Figure 4:
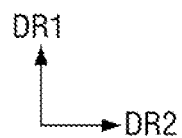
Figure 5:
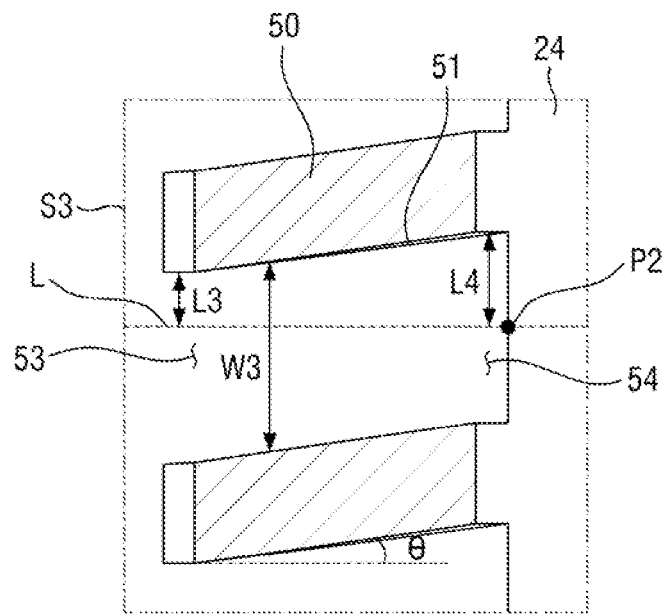
FIG. 5 is an enlarged view of a region S3 of FIG. 3 according to an exemplary embodiment of the present inventive concepts.
Figure 5:
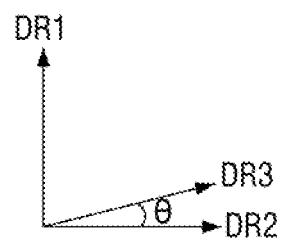

FIG. 4 is an enlarged view of a region S2 of FIG. 3 according to an exemplary embodiment of the present inventive concepts. FIG. 5 is an enlarged view of a region S3 of FIG. 3 according to an exemplary embodiment of the present inventive concepts.

Referring to the exemplary embodiments of FIGS. 3 to 5, the gas injection port 32 may include a first inlet 33 and a first outlet 34. The process gas may flow into the first inlet 33 from the nozzle 30. The process gas may be injected into the first outlet 34 from the gas injection port 32. For example, the process gas may pass from the first inlet 33 to the first outlet 34.

As shown in the exemplary embodiment of FIG. 5, the slit 52 may include a second inlet 53 and a second outlet 54. The process gas injected from the gas injection port 32 may flow into the second inlet 53. The second outlet 54 on the slit 52 may allow the process gas flowing into the second inlet 53 to be discharged to the substrate 1 disposed on the support member 22.

As shown in the exemplary embodiment of FIG. 4, a first point P1 may be defined at the center (e.g., in the first direction DR1) of the first inlet 33. As shown in the exemplary embodiment of FIG. 5, a second point P2 may be defined at the center (e.g., in the first direction DR1) of the second outlet 54. The center line L may be defined by a line which connects the first point P1 and the second point P2. The process gas may move, for example, along the center line L. For example, the process gas may move in the second direction DR2 and may sequentially pass through the first inlet 33, the first outlet 34, the second inlet 53, and the second outlet 54.

A first distance L1 may mean a distance from the center line L to an end of the first inlet 33 (e.g., a lateral end of the first inlet 33 in the first direction DR1 formed by a first fluid passage face 31 described herein). A third distance L3 may mean a distance from the center line L to an end of the second inlet 53 in the first direction DR1. A fourth distance L4 may mean a distance from the center line L to an end of the second outlet 54 in the first direction DR1.

In the semiconductor device according to exemplary embodiments of the present inventive concepts, the first distance L1 and the second distance L2 may be different from each other and/or the third distance L3 and the fourth distance L4 may be different from each other. The second distance L2 may mean a distance from the center line L to an end of the first outlet 34. For example, the first distance L1 may be different from the second distance L2. As shown in the exemplary embodiment of FIG. 4, the first distance L1 may be greater than the second distance L2. The third distance L3 and the fourth distance L4 may be different from each other. As shown in the exemplary embodiment of FIG. 5, the fourth distance L4 may be greater than the third distance L3.

As shown in the exemplary embodiment of FIG. 4, the first inlet 33 may have a first width W1 (e.g., length in the first direction DR1).

The first outlet 34 may have a width (e.g., length in the first direction DR1) that is different from the width of the first inlet 33. The first outlet 34 may have a second width W2. As shown in the exemplary embodiment of FIG. 4, the second width W2 may be less than the first width W1. For example, the first outlet 34 may have a width that is less than the width of the first inlet 33.

The smaller second width W2 of the first outlet 34 with respect to the first width W1 of the first inlet 33 may increase the pressure of the source gas in the first outlet 34 as compared to the pressure of the source gas in the first inlet 33. Therefore, the velocity of the source gas in the first outlet 34 may be increased by the pressure difference between the first inlet 33 and the first outlet 34. In addition, an amount of source gas to be supplied onto the substrate 1 may increase thereby.

In an exemplary embodiment, a ratio of the second width W2 of the first outlet 34 to the first width W1 of the first inlet 33 may be in a range of 0.6 to 1. For example, the second width W2 may be between 60% to 100% of the first width W1. Hereinafter, a description will be given with reference to the exemplary embodiments of FIGS. 4-5.

The gas injection port 32 according to an exemplary embodiment of the present inventive concepts may have different widths depending on the position corresponding to the slit 52. For example, the second width W2 of the first outlet 34 may be adjusted depending on the target velocity corresponding to each position of the substrate 1. Therefore, the gas injection port may have different width ratios of the outlet to the inlet depending on the position.

The gas injection port 32 may be defined by a first fluid passage face 31. The first fluid passage face 31 may mean a surface through which the process gas passes through the gas injection port 32. Alternatively, the first fluid passage face 31 may be a face on which the gas injection port 32 and the nozzle tube 40 are in contact with each other.

In an exemplary embodiment, the first fluid passage face 31 may have a convex shape in the direction towards the center line L. The first fluid passage face 31 may have a convex shape on the basis of the center line L.

Therefore, a boundary face connected from the first inlet 33 to the first outlet 34 has a continuous form. Therefore, the increase in the velocity from the first outlet 34 may be maximized. In addition, heat will be applied to the semiconductor manufacturing apparatus in the semiconductor processes in later processes. At this time, since the first fluid passage face 31 has a convex shape, it is possible to prevent or improve the concentration of the thermal stress on the first inlet 33 and the first outlet 34.

The slit 52 may have a certain width (e.g., length in the first direction DR1). For example, in an exemplary embodiment, the slit 52 may have the third width W3 in the first direction DR1. The slit 52 may be defined by a second fluid passage face 51. The second fluid passage face 51 may mean a face through which the process gas passes through the slit 52.

As shown in the exemplary embodiment of FIG. 5, the slit 52 may have an inclination $\theta$ of an acute angle with respect to the second direction DR2. The process gas discharged from the first outlet 34 may be supplied to the substrate 1 through the slit 52. Due to the inclination of the slit 52, the process gas may be supplied to an upper side (e.g., in the first direction DR1). Therefore, the amount of process gas to be supplied to the substrate 1 may be increased.

The substrate 1 may receive the process gas from the slit 52. At this time, a down flow may be generated to a space between the slit 52 and the substrate 1. For example, the process gas may move downward with respect to the second direction DR2 in the space between the slit 52 and the substrate 1, without moving to the center of the substrate 1 because the flow resistance in the space between the slit 52 and the substrate 1 is smaller than at the center of the substrate 1. Therefore, the supply efficiency of the process gas or gas precursor to be supplied onto the substrate 1 may be degraded. In addition, the degradation of the supply efficiency of the process gas or gas precursor may affect the dispersion and the step coverage deterioration.

However, in the semiconductor manufacturing apparatus according to an exemplary embodiment of the present inventive concepts, since the slit 52 may have an inclination θ of an acute angle with respect to the second direction DR2, it is possible to reduce or prevent the down flow of the process gas that has passed through the slit 52. Accordingly, the supply efficiency of the process gas supplied onto the substrate 1 is increased, and the supply efficiency of the precursor gas is also increased.

Figure 6:
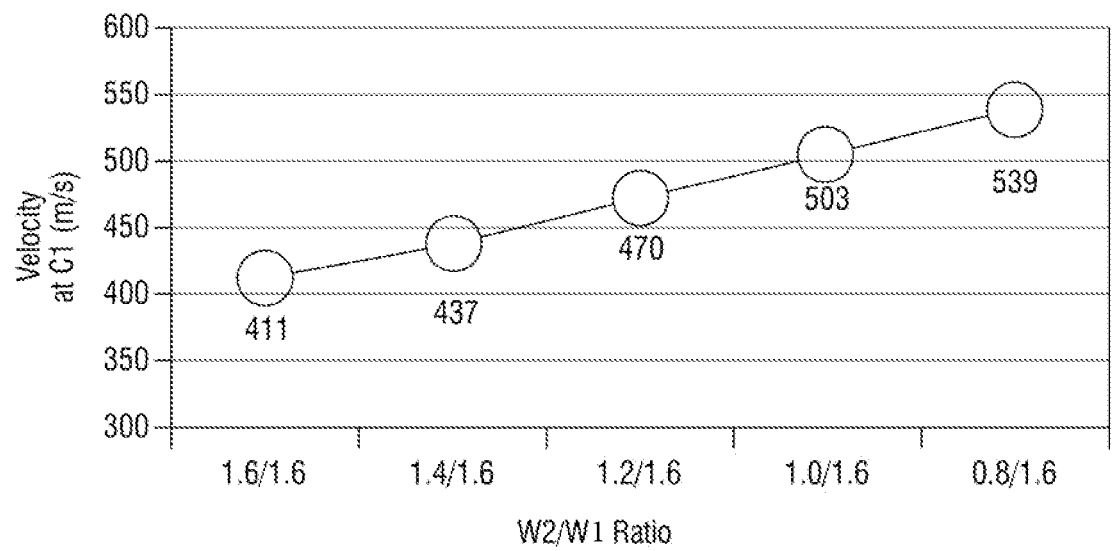
FIG. 6 is a graph showing a velocity of the semiconductor manufacturing apparatus according to an exemplary embodiment of the present inventive concepts.

FIG. 6 is a graph showing the velocity of the semiconductor manufacturing apparatus according to an exemplary embodiment of the present inventive concepts.

Referring to the exemplary embodiment of FIGS. 4 and 6, an X-axis means a ratio of the second width W2 of the first outlet 34 to the first width W1 of the first inlet 33 of the gas injection port 32, and a Y axis means the velocity in meters per second (m/sec) at the first center point C1 of the first outlet 34.

As compared to an embodiment in which the ratio of the second width W2 of the first outlet 34 to the first width W1 of the first inlet 33 of the gas injection port 32 is 1.6/1.6, when the ratio of the second width W2 of the first outlet 34 to the first width W1 of the first inlet 33 to is 0.8/1.6, the velocity at the first center point C1 increases by about 31% from 411 m/s to 539 m/s.

As the second width W2 of the first outlet 34 decreases, the velocity at the first center point C1 increases due to the Bernoulli effect. Therefore, as the ratio of the second width W2 of the first outlet 34 to the first width W1 of the first inlet 33 decreases, the velocity at the first center point C1 of the first outlet 34 increases.

Since the velocity at the first center point C1 of the first outlet 34 increases, the amount of process gas reaching the substrate 1 may increase. Therefore, the supply efficiency of the process gas and gas precursor is improved.

Figure 7:
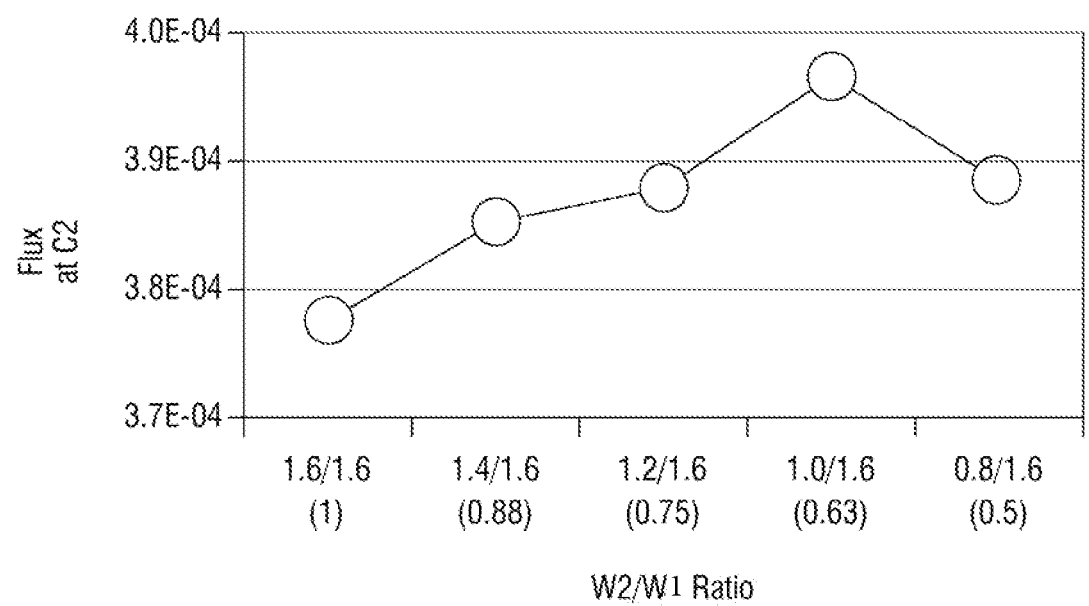
FIG. 7 is a graph showing a flux of the semiconductor manufacturing apparatus according to an exemplary embodiment of the present inventive concepts.

FIG. 7 is a graph showing the flux of the semiconductor manufacturing apparatus according to an exemplary embodiment of the present inventive concept.

Referring to FIGS. 2, 4 and 7, an X-axis means a ratio of the second width W2 of the first outlet 34 to the first width W1 of the first inlet 33 of the gas injection port 32, and a Y-axis means a flux at the second center point C2 of the substrate 1.

As the ratio of the second width W2 of the first outlet 34 to the first width W1 of the first inlet 33 decreases, the flux (e.g., in kg/m$^2$s) at the second center point C2 of the substrate 1 increases. As described above in FIG. 5, this is because as the ratio of the second width W2 of the first outlet 34 to the first width W1 of the first inlet 33 decreases, the flux of the process gas to be discharged from the first outlet 34 increases.

However, if the ratio of the second width W2 of the first outlet 34 to the first width W1 of the first inlet 33 is less than 0.63 (e.g., less than a 1.0/1.6 ratio), the flux at the second center point C2 of the substrate 1 begins to decrease. This is because if the second width W2 of the first outlet 34 has too small value, the absolute amount of process gas that passes through the first outlet 34 decreases. Accordingly, the ratio of the second width W2 of the first outlet 34 to the first width W1 of the first inlet 33 may be in a range of about 0.6 to about 1. In an exemplary embodiment, at least one of the plurality of slits 52 (e.g., a second slit) arranged in the first direction DR1 may have a different second width W2 of the first outlet 34 than the second width W2 of other slits 52 (e.g., a first slit) and the ratio of the second width W2 of the first outlet 34 to the first width W1 of the first inlet 33 of the second slit may still be within the range of about 0.6 to about 1.

Figure 8:
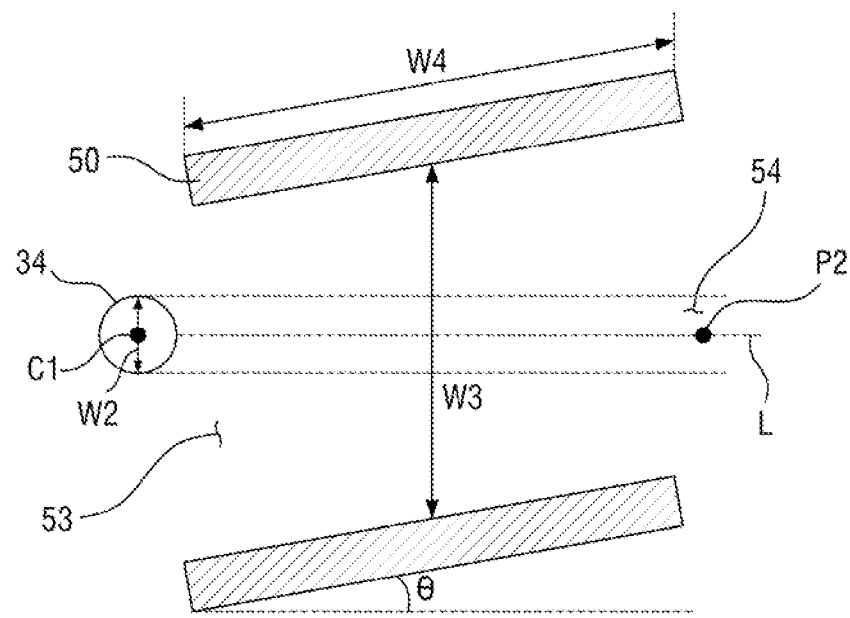
FIG. 8 is a plan view showing portions of the semiconductor manufacturing apparatus for explaining a slit according to an exemplary embodiment of the present inventive concept.
Figure 8:
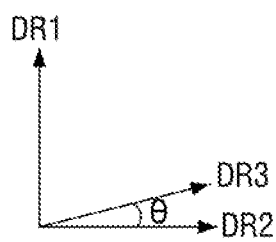
Figure 9:
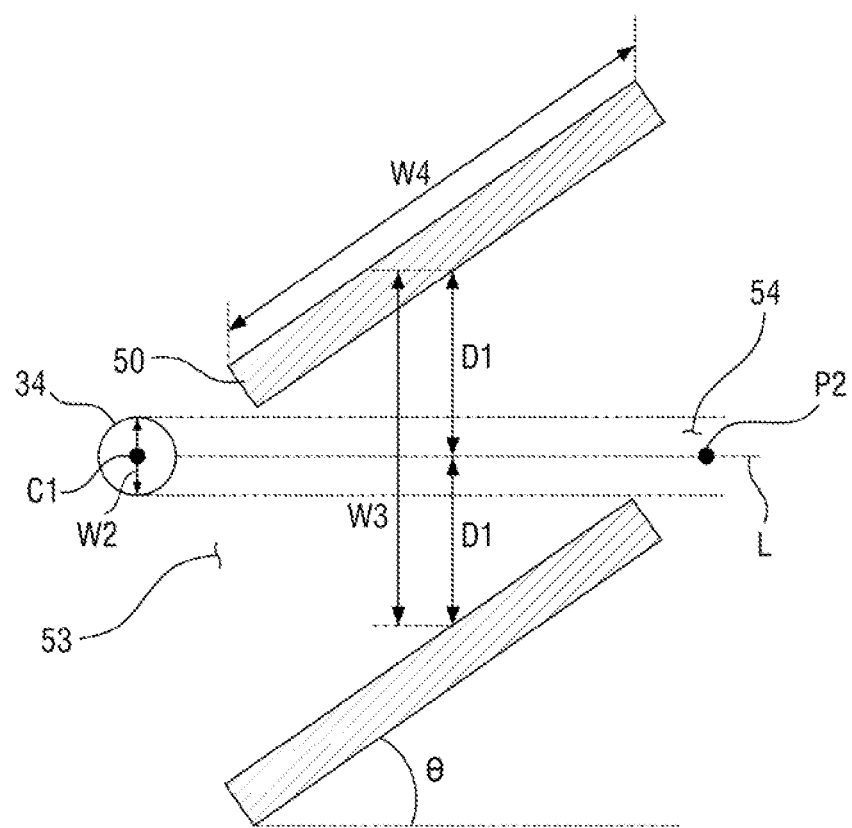
FIG. 9 is a plan view showing portions of the semiconductor manufacturing apparatus for explaining a slit according to an exemplary embodiment of the present inventive concept.
Figure 9:
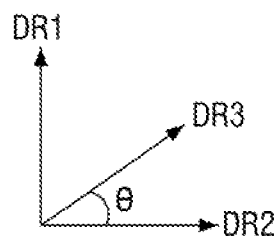

FIGS. 8 and 9 are diagrams for explaining slits according to exemplary embodiments of the present inventive concepts. FIGS. 8 and 9 are plan views of FIG. 3.

Referring to the exemplary embodiments of FIGS. 5 and 8, the slit 52 may be formed in the inner tube 50. The slit 52 may correspond to the opening part of the inner tube 50.

The slit 52 may have a third width W3 in the first direction DR1. The slit 52 may have an inclination θ of an acute angle in the first direction DR1 with respect to the second direction DR2. Here, a direction having an inclination θ with respect to the second direction DR2 may be defined as a third direction DR3. As shown in the exemplary embodiment of FIG. 8, the slit 52 may have a fourth width W4 in the third direction DR3.

The first outlet 34 of the gas injection port 32 may have a second width W2 in the first direction DR1.

The first outlet 34 of the gas injection port 32 may face the center of the slit 52. Since the process gas injected from the first outlet 34 needs to pass through the slit 52, an imaginary line extending from the first outlet 34 in the second direction may not penetrate the inner tube 50. Therefore, in an exemplary embodiment, the slit 52 may not have a value greater than a certain inclination θ. Further, the constant inclination θ may mean an inclination in which the process gas injected from the first outlet 34 is not disturbed by the inner tube 50.

Referring to FIGS. 5 and 9, in an exemplary embodiment, a value twice the distance D1 (e.g., length in the first direction DR1) from the center line L to the center of the second fluid passage face 51 with respect to the third direction DR3 is greater than the second width W2. This is because the imaginary line extending from the first outlet 34 may not penetrate the inner tube 50. Therefore, a relationship such as Formula 1 may be established.

$$2*D1 = 2*\frac{W4}{2}\sin\theta + W2 < W3 \quad \text{[Formula 1]}$$

$$\sin\theta < \frac{(W3-W2)}{W4}$$

In the semiconductor manufacturing apparatus according to an exemplary embodiment of the present inventive concepts, the second width W2 of the first outlet 34 is 1.2 mm, the fourth width W4 of the slit 52 is 5 mm, and the inclination θ of the slit 52 may have a value in a range of about 0 degrees to about 35 degrees.

Therefore, according to Formula 1, in the semiconductor manufacturing apparatus according to an exemplary embodiment of the present inventive concepts, the ratio of the difference between the third width W3 and the second width W2 to the fourth width W4 may be smaller than 0.56.

Figure 10:
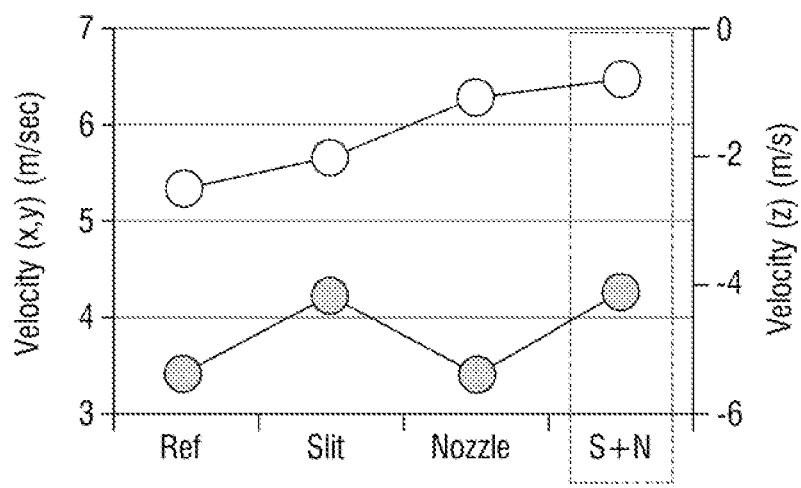
FIG. 10 is a graph showing the velocity of the semiconductor manufacturing apparatus according to an exemplary embodiment of the present inventive concepts.

FIG. 10 is a graph showing the flux of the semiconductor manufacturing apparatus according to an exemplary embodiment of the present inventive concepts.

Referring to the exemplary embodiments of FIGS. 2 and 10, the X-axis means a conventional semiconductor manufacturing apparatus (Ref), a semiconductor manufacturing apparatus (Slit) that includes the slit according to an exemplary embodiment of the present inventive concepts, a semiconductor manufacturing apparatus (Nozzle) that includes the nozzle according to an exemplary embodiment of the present inventive concepts, and a semiconductor manufacturing apparatus (S+N) that includes the slit and the nozzle according to exemplary embodiments of the present inventive concepts, and the Y-axis means a velocity (e.g., in m/sec).

The graph with colorless graph points indicates the velocity of the process gas at the first center point C1 of the first outlet 34, and the graph with the shaded graph points indicates the flux of the process gas flowing down into the space between the slit 52 and the substrate 1. Herein, the negative value means a direction opposite to the first direction DR1.

The velocity of the process gas at the first center point C1 increases in the semiconductor manufacturing apparatus (Slit) which includes a slit as compared to a conventional semiconductor manufacturing apparatus (Ref). The semiconductor manufacturing apparatus (Nozzle) to which includes a nozzle has a higher velocity than the semiconductor manufacturing apparatus that includes a slit. The semiconductor manufacturing apparatus (S+N) which includes a slit and a nozzle has a higher velocity than the semiconductor manufacturing apparatus that includes a nozzle.

Further, the velocity of the process gas flowing down into the space between the slit 52 and the substrate 1 decreases in the semiconductor manufacturing apparatus (Slit) to which the slit is applied.

In an embodiment of the semiconductor manufacturing apparatus (S+N) to which both the slit and the nozzle are applied, the velocity of the process gas at the first center point C1 and the velocity of the process gas flowing down into the space between the slit 52 and the substrate 1 increases as compared to the other embodiments. Therefore, the supply efficiency of the precursor supplied onto the substrate 1 may be improved or enhanced.

Figure 11:
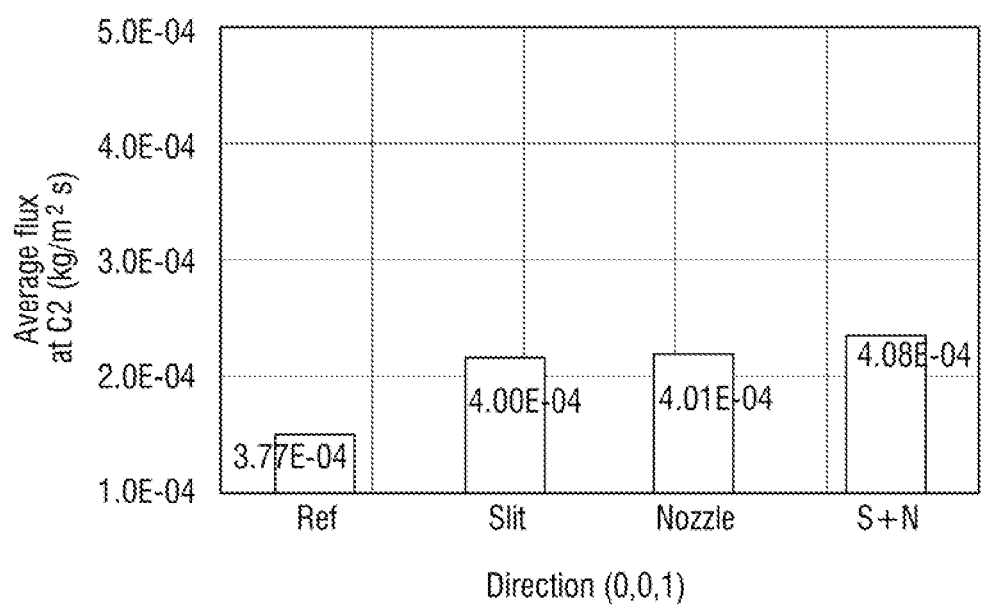
FIG. 11 is a graph showing the flux of the semiconductor manufacturing apparatus according to an exemplary embodiment of the present inventive concepts.

FIG. 11 is a graph showing the flux of the semiconductor manufacturing apparatus according to an exemplary embodiment of the present inventive concepts. Referring to the exemplary embodiments of FIGS. 2 and 11, the Y-axis means an average flux at the second center point C2 of the substrate 1.

When compared with conventional semiconductor manufacturing apparatus, the average flux at the second center point C2 of the substrate 1 increases in the semiconductor manufacturing apparatus (Slit) that includes the slit according to an exemplary embodiment of the present inventive concepts, the semiconductor manufacturing apparatus (Nozzle) that includes the nozzle according to an exemplary embodiment of the present inventive concepts, and the semiconductor manufacturing apparatus (S+N) that includes the slit and the nozzle according to an exemplary embodiment of the present inventive concepts.

Figure 12:
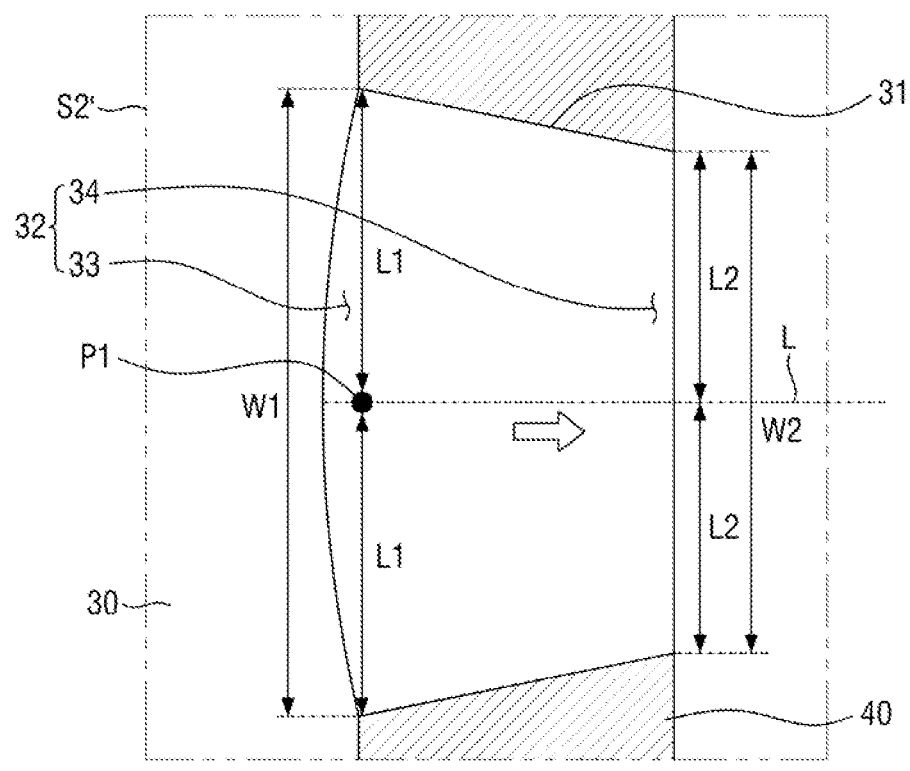
FIG. 12 is an enlarged view of a region "S2" of FIG. 3 of the semiconductor manufacturing apparatus according to an exemplary embodiment of the present inventive concepts.
Figure 12:
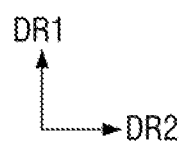

FIG. 12 is an enlarged view of a region "S2" of FIG. 3 of the semiconductor manufacturing apparatus according to an exemplary embodiment of the present inventive concepts. Differences from FIG. 4 will be mainly explained for convenience of explanation.

Referring to the exemplary embodiments of FIGS. 3 and 12, a first distance L1 may decrease as the process gas moves along the center line L (e.g., in the second direction DR2). The first fluid passage face 31 may have a generally planar shape (e.g., extending at an angle between the first direction DR1 and the second direction DR2.

In the semiconductor manufacturing apparatus according to an exemplary embodiment of the present inventive concepts, since the second width W2 of the first outlet 34 is smaller than the first width W1 of the first inlet 33, the velocity may increase at the first outlet 34. Therefore, the amount of process gas to be supplied to the substrate may increase.

While the present inventive concepts have been shown and described with reference to exemplary embodiments thereof, it will be apparent to those of ordinary skill in the art that various modifications in form and details may be made thereto without departing from the spirit and scope of the present inventive concept as set forth by the appended claims.

What is claimed is:

1. A semiconductor manufacturing apparatus comprising:
    a process chamber;
    a boat disposed in the process chamber and including a plurality of support members spaced apart from one another in a first direction, wherein a plurality of substrates are stacked on the plurality of support members, respectively, in the first direction;
    an inner tube enclosing the boat, the inner tube including a slit formed along a side wall of the boat extending in the first direction; and
    a nozzle disposed in the process chamber that is configured to supply a process gas, the nozzle including a gas injection port formed at a position corresponding to the slit,
    wherein the slit is formed at a position corresponding to a space between adjacent support members of the plurality of support members and has a first upward inclination of an acute angle with respect to a second direction that is perpendicular to the first direction to direct the process gas from the nozzle though the slit and into the space between the adjacent support members of the plurality of support members.

2. The semiconductor manufacturing apparatus of claim 1, wherein a first width of the slit in the first direction is smaller than or equal to a distance between adjacent support members of the plurality of support members in the first direction.

3. The semiconductor manufacturing apparatus of claim 1, wherein a first width of the slit in the first direction is constant throughout the slit.

4. The semiconductor manufacturing apparatus of claim 3, wherein:
    the gas injection port has a second width in the first direction; and
    the first width is greater than the second width.

5. The semiconductor manufacturing apparatus of claim 4, wherein:
    the slit has a third width in a third direction that is parallel to the first upward inclination with respect to the second direction; and
    a ratio of a difference between the first width and the second width to the third width is smaller than 0.56.

6. The semiconductor manufacturing apparatus of claim 1, wherein a center point of the slit in a second direction that is perpendicular to the first direction is aligned in the second direction with a center point of the nozzle in the second direction.

7. The semiconductor manufacturing apparatus of claim 6, wherein an imaginary line extending from the gas injection port in the second direction perpendicular to the first direction does not penetrate the inner tube.

8. The semiconductor manufacturing apparatus of claim 1, wherein a number of slits is same as a number of the plurality of substrates stacked on the plurality of support members.

9. The semiconductor manufacturing apparatus of claim 1, wherein the boat further includes a vertical member extending in the first direction and connecting the plurality of support members to each other.

10. The semiconductor manufacturing apparatus of claim 1, wherein each of the plurality of substrates is stacked in contact with an upper portion of a corresponding one of the plurality of support members, and
    the slit having the first upward inclination of the acute angle is inclined downward as the slit becomes farther from a center axis of the boat.

* * * * *